United States Patent [19]

Anderson et al.

[11] Patent Number: 4,995,958

[45] Date of Patent: Feb. 26, 1991

[54] SPUTTERING APPARATUS WITH A ROTATING MAGNET ARRAY HAVING A GEOMETRY FOR SPECIFIED TARGET EROSION PROFILE

[75] Inventors: Robert L. Anderson; John C. Helmer, both of Palo Alto, Calif.

[73] Assignee: Varian Associates, Inc., Palo Alto, Calif.

[21] Appl. No.: 355,713

[22] Filed: May 22, 1989

[51] Int. Cl.$^5$ .............................................. C23C 14/35
[52] U.S. Cl. .............................................. 204/298.200
[58] Field of Search ....................... 204/298 MM, 298.2

[56] References Cited

U.S. PATENT DOCUMENTS

| 4,444,643 | 4/1984 | Garrett | 204/298.2 |
| 4,872,964 | 10/1989 | Suzuki et al. | 204/298.2 |

FOREIGN PATENT DOCUMENTS

| 0211412A2 | 2/1987 | European Pat. Off. | 204/298.2 |
| 62-211375 | 9/1987 | Japan | 204/298.2 |
| 63-149374 | 6/1988 | Japan | 204/298.2 |

*Primary Examiner*—Aaron Weisstuch
*Attorney, Agent, or Firm*—Stanley Z. Cole; Sheri M. Novack

[57] ABSTRACT

A magnetron sputtering apparatus includes a rotatable magnet. At least a portion of the centerline of the magnet lies on a curve defined by $$\theta = \int_1^r \frac{\sqrt{\xi^2(u)u^2 - 1}}{u} du + C$$

where $\xi(u)$ is a preselected erosion profile. When stationary, the magnet generates a localized magnetic field of approximately constant width. In operation, when the magnet is rotated, it generates the preselected erosion profile in the target. The preselected erosion profile may be constant.

9 Claims, 12 Drawing Sheets

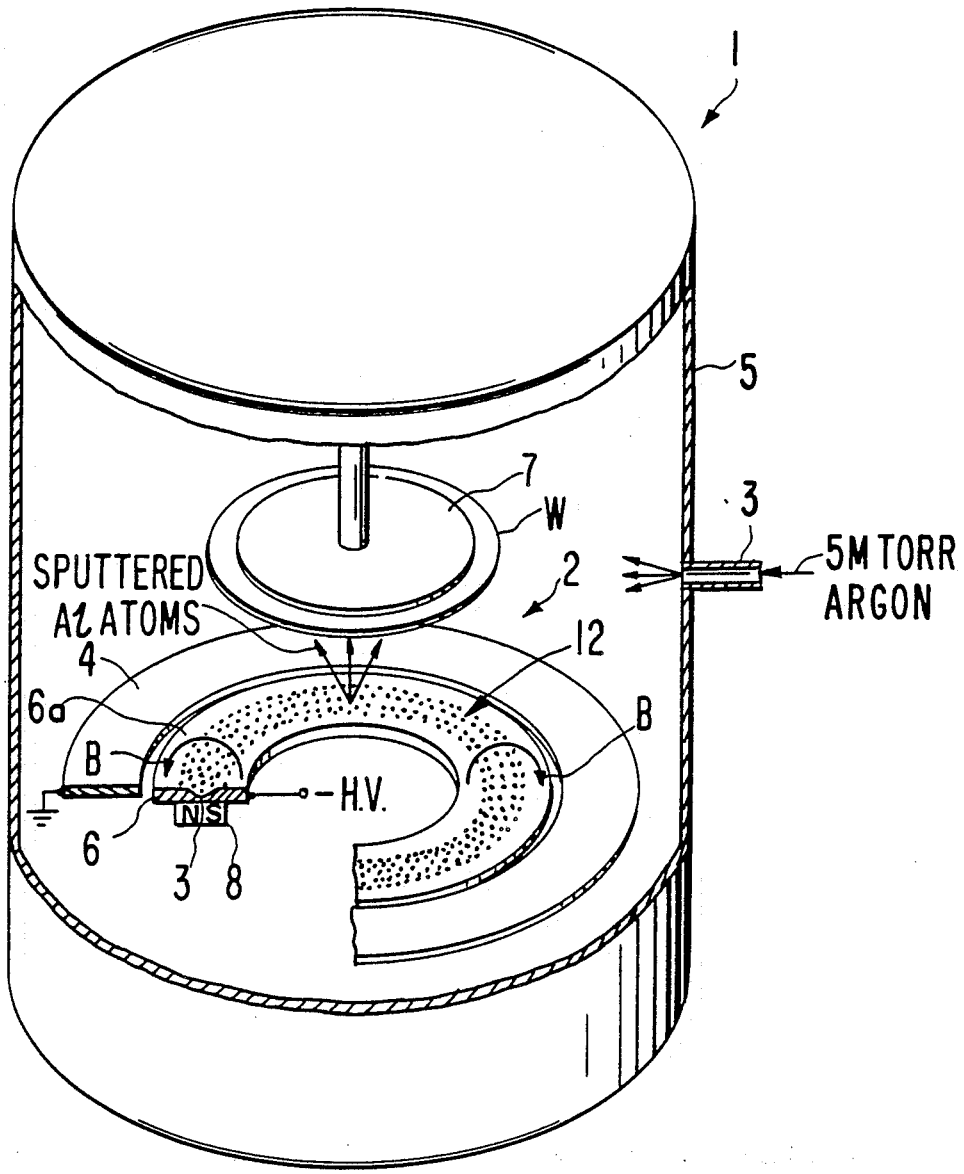
FIG. IA
PRIOR ART
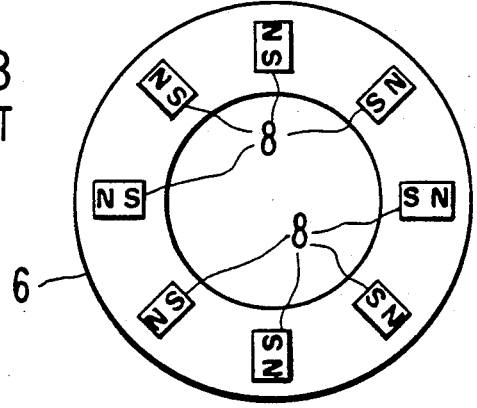
FIG. IB
PRIOR ART

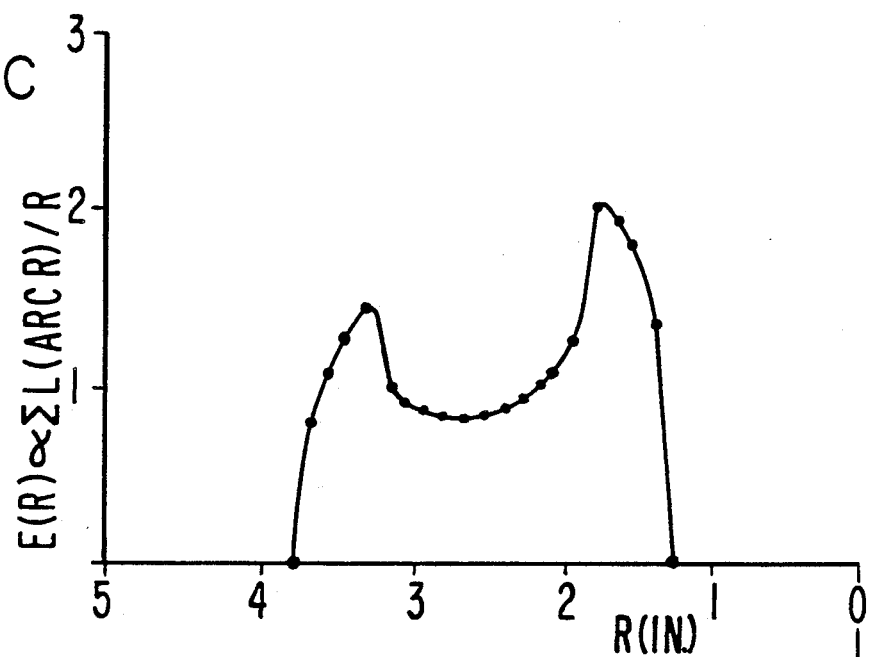
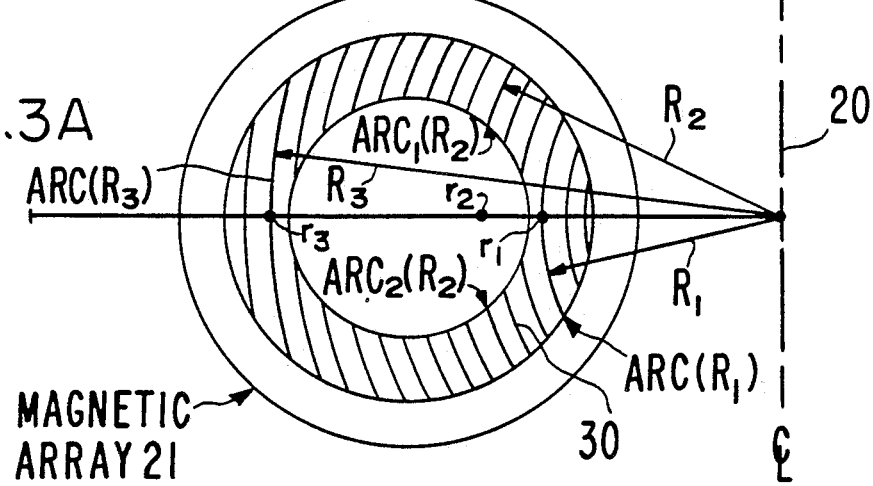
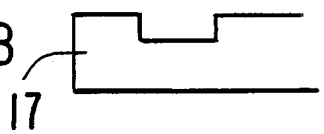

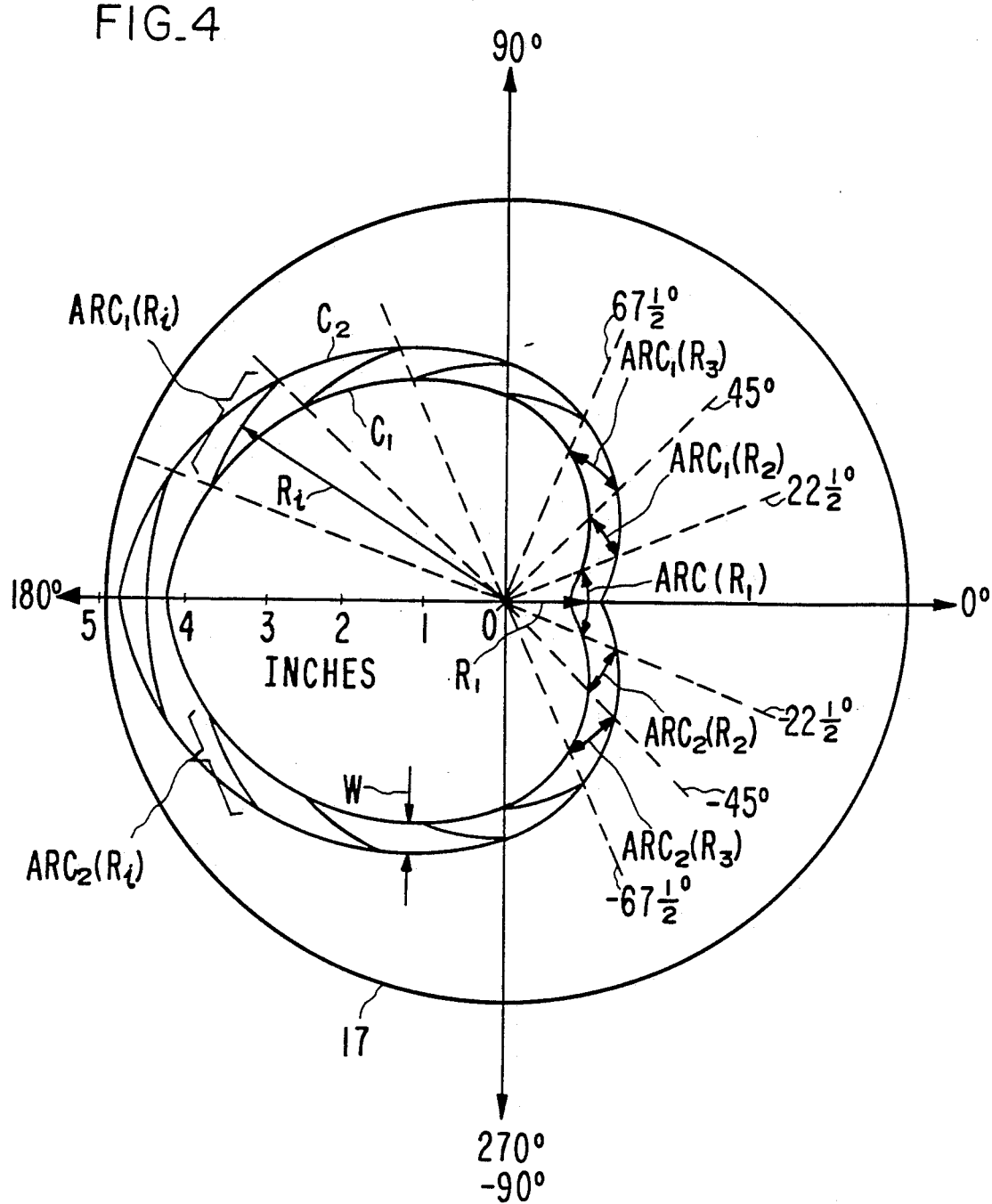

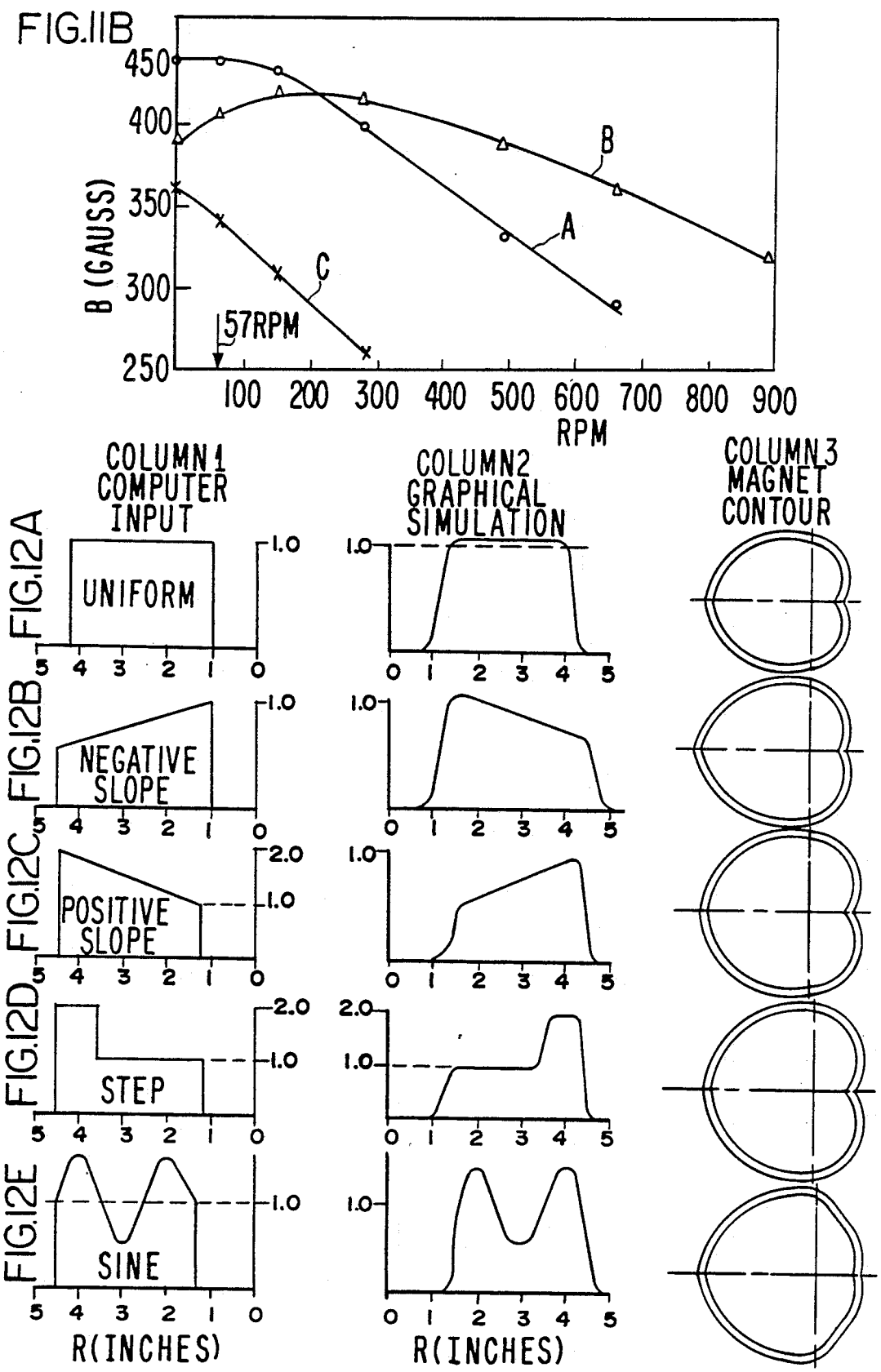

SPUTTERING APPARATUS WITH A ROTATING MAGNET ARRAY HAVING A GEOMETRY FOR SPECIFIED TARGET EROSION PROFILE

FIELD OF THE INVENTION

This invention relates to a sputtering apparatus and in particular, to a sputtering apparatus having a rotatable array of magnets arranged in a geometry that provides a selected erosion profile.

BACKGROUND OF THE INVENTION

Planar magnetrons have long been used by the semiconductor processing industry in sputtering devices to coat silicon wafers with various materials, for example aluminum, during the manufacture of integrated circuits.

A sputtering device with a stationary planar magnetron is typically a high rate sputtering device which represents an enormous improvement over devices based on diode sputtering or evaporative techniques. However, a sputtering device with a stationary planar magnetron has practical shortcomings, the most serious of which is that the plasma discharge erodes a narrow groove in the target. This localized erosion generates a non-uniform distribution of sputtered atoms which results in a deposition on the semiconductor wafer having non-uniform step coverage.

Numerous attempts, some partially successful, have been made to modify such a source to extend the target erosion and to make the distribution of sputtered atoms more uniform. For example, U.S. Pat. No. 4,444,643, which is incorporated herein by reference, describes a sputtering device which includes a mechanically rotated permanent magnet assembly. The rotation of the permanent magnet assembly causes erosion over a wider area of the target.

Other attempts have been made to spread out the erosion over a larger surface area using extended magnetic fields. The magnets required for such an approach are large and complicated, and it is difficult to assure that the properties of the magnetron do not change as the target erodes away. The resulting erosion pattern is thus difficult to predict.

Special arrangements of the magnets have also been suggested for producing more uniform erosion. One such arrangement is described in European Patent Application Publication No. 211,412 (or U.S. Pat. No. 4,872,964 which was based on the same Japanese priority case) entitled Magnetron Sputtering Apparatus and its Magnetic Source, published Feb. 25, 1987. Another such arrangement is described in Japanese Patent Application Publication (Kokai) No. 62-211,375 entitled Sputtering Apparatus, published Mar. 11, 1986. As is discussed in this disclosure, our work shows that neither of these suggested arrangements will produce uniform erosion.

SUMMARY OF THE INVENTION

A magnetron sputtering apparatus is provided which includes a rotatable magnet. The magnet is configured so that a portion of the centerline of the magnet is describable by an equation in polar coordinates $(r,\theta)$ of the form $$\theta = \int_1^r \frac{\sqrt{(\xi^2(u)u^2 - 1}}{u} du + C$$

where $\xi(u)$ is a preselected normalized erosion profile and C is a selected constant.

In general, the above definite integral can be evaluated using numerical integration.

In the important special case where the preselected erosion profile is constant, the above equation reduces to $$\theta = \sqrt{r^2 - 1} - \arctan \sqrt{r^2 - 1} + C$$

The centerline of the magnetic means can be constructed as a closed curve by employing symmetry. In one embodiment, a first segment of the centerline is defined by one of the above equations over the interval $\theta_0 \leq \theta \leq \theta_0 + \pi$, and the closed centerline is constructed by reflecting the first segment about the line $\theta = \theta_0$. When a magnet of substantially constant width and strength is so configured and is rotated about the polar origin, the erosion profile in the target generated by the sputtering apparatus is the preselected erosion profile.

If a substantial portion of the centerline of the magnetic means is defined by either of the above equations, a closed centerline can be constructed by connecting the endpoints of the substantial portion by one or more curves which do not satisfy the above equations, but then the erosion profile generated will deviate somewhat from the preselected profile.

In one embodiment for producing a constant erosion profile, a plurality of magnets having the same dimensions and strength are arranged with their centers on the curve defined by the latter of the above equations. The magnetic field is made uniform by the use of keepers of magnetic material which retain the magnets and shape the magnetic contour of the magnet.

BRIEF DESCRIPTION OF THE DRAWINGS

FIG. 1A shows a partially schematic perspective view of a prior art sputtering device which includes a stationary planar magnetron;

FIG. 1B shows a schematic view of the magnet arrangement in the prior art structure illustrated in FIG. 1A.

FIG. 3A shows the erosion region on the target generated by a stationary circular annular magnetic configuration;

FIG. 3B shows the assumed stationary erosion profile generated by the magnetic assembly in FIG. 3A when said assembly is stationary;

FIG. 3C shows the erosion profile generated by the rotation of the magnetic array shown in FIG. 3A;

FIG. 4 illustrates a geometric construction for an erosion region having nonuniform width W and satisfying the equation $$E(R) = k\Sigma L(\text{arc } (R))/R = K$$

Figure 5:
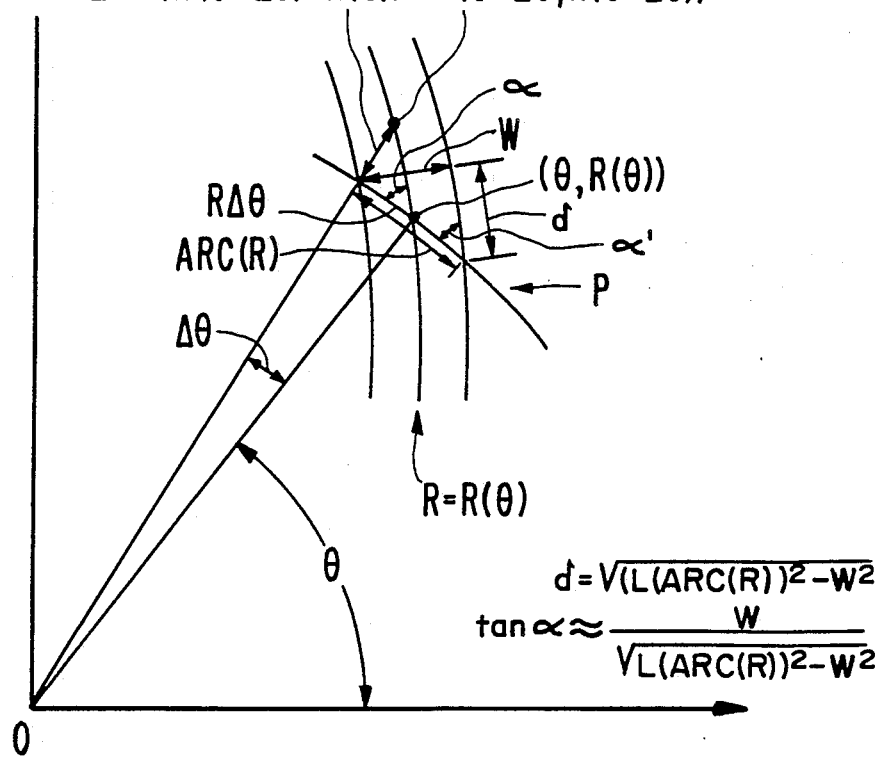
Figure 6A:
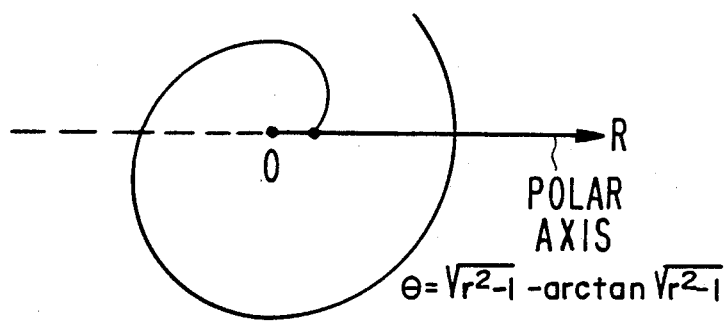
Figure 6B:
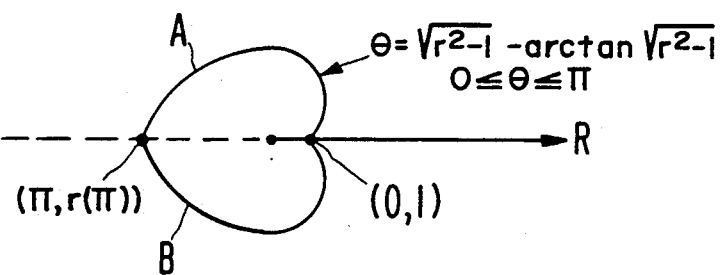
Figure 6C:
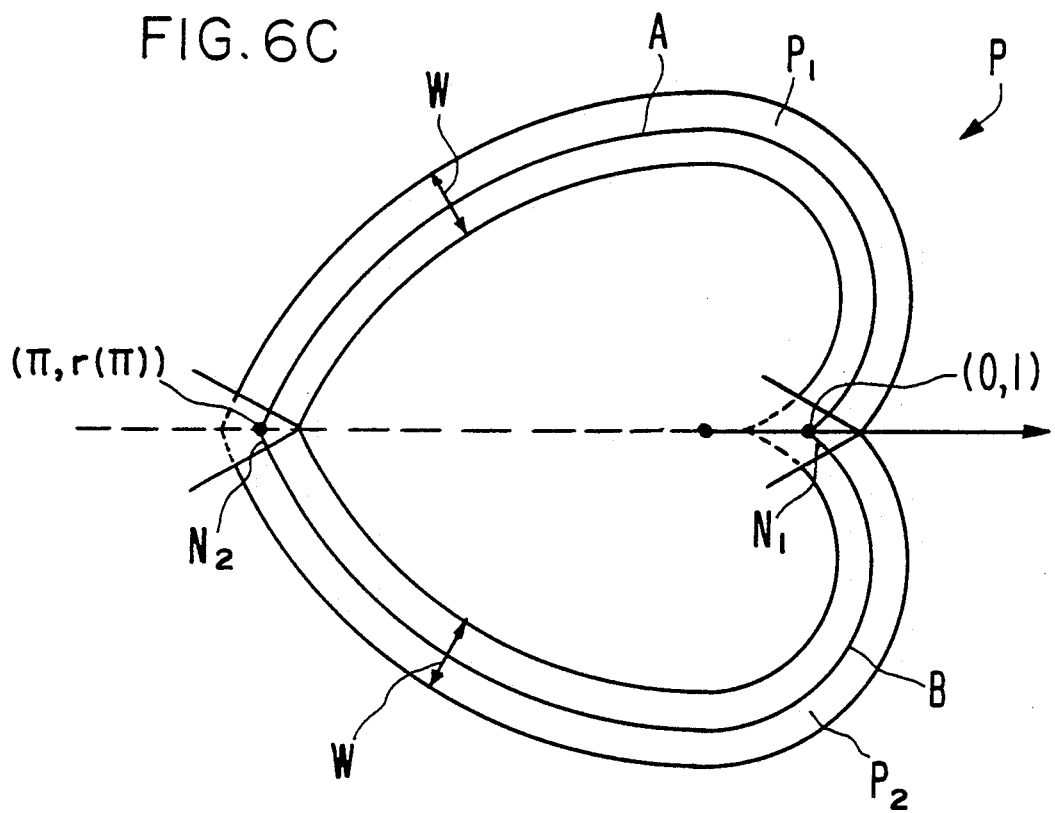
Figure 7A:
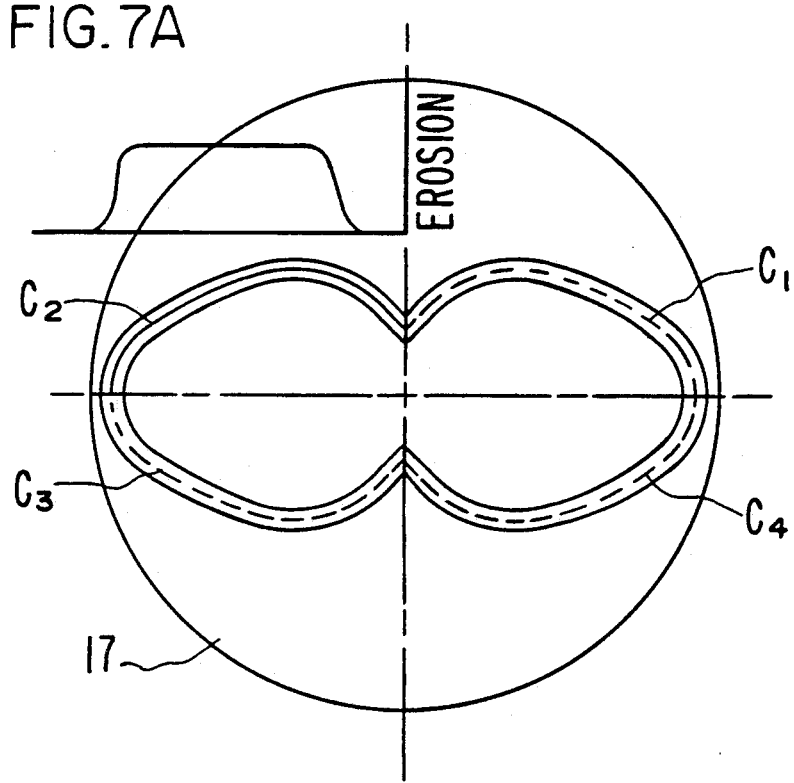
Figure 7B:
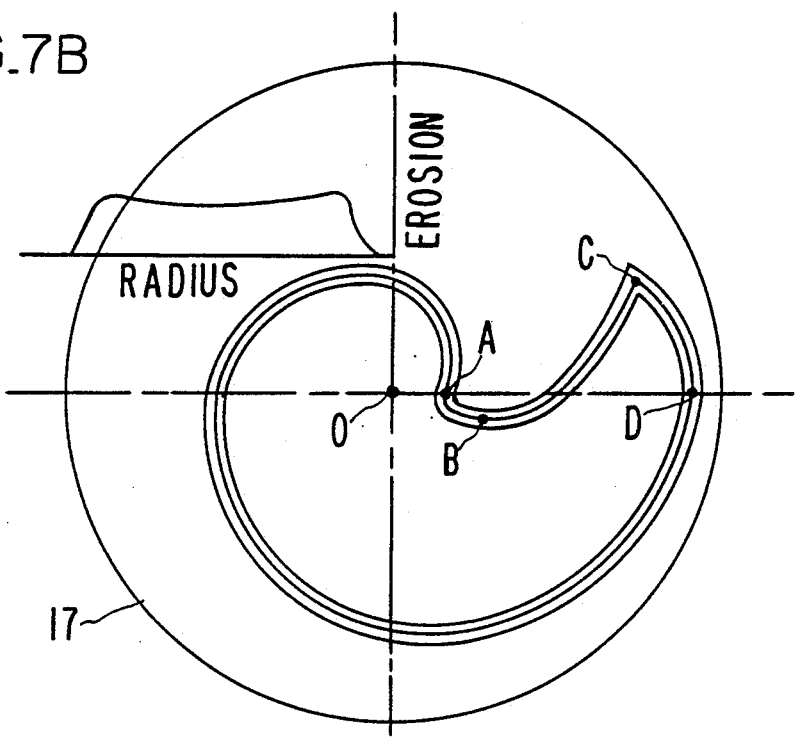
Figure 8B:
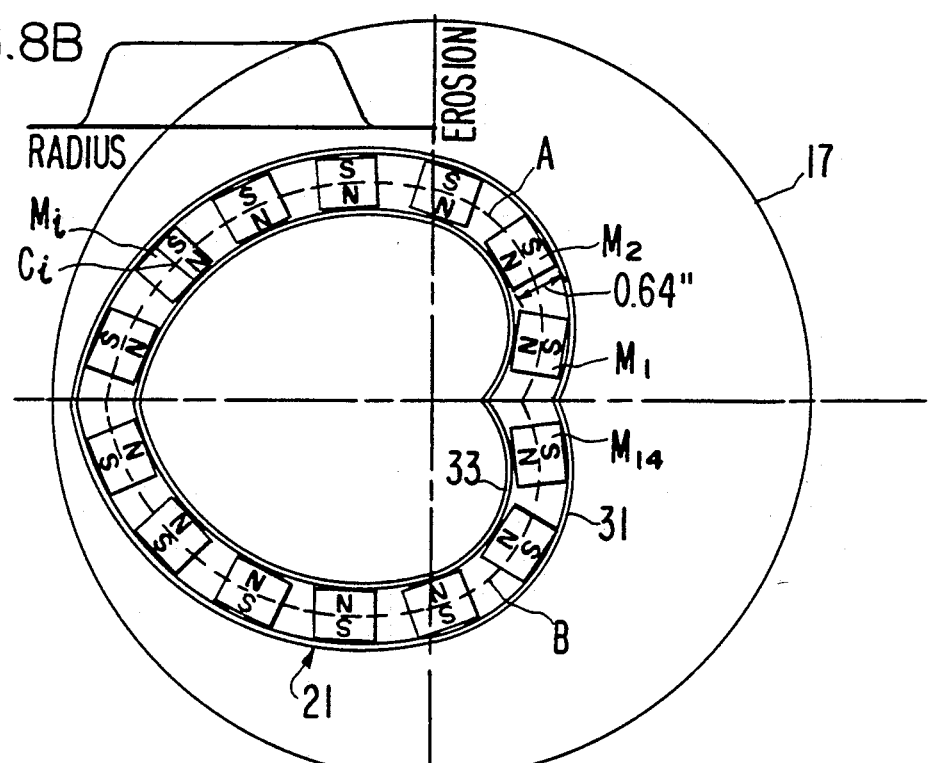
Figure 8A:
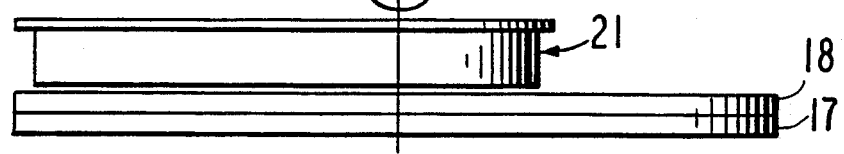

where K is a constant;

FIG. 5 shows the path element having constant width and the associated quantities for deriving the equation of the centerline of the path;

FIG. 6A shows a graph of the solution of Equation (13);

FIG. 6B shows a closed loop curve generated from the curve shown in FIG. 6A by reflecting a portion of the curve shown in FIG. 6A about the axis;

FIG. 6C is an expanded version of FIG. 6B showing a path of constant width centered around the upper and lower portions of the closed loop curve, except for relatively small regions at $\theta=0$ and $\theta=\pi$, where the width deviates from being constant;

FIGS. 7A and 7B show alternate multi-lobe embodiments indicating the location of the centerline of the magnets;

FIG. 8A shows one embodiment of the present invention;

FIG. 8B shows the erosion profile generated by the embodiment of FIG. 8A.

Figure 9:
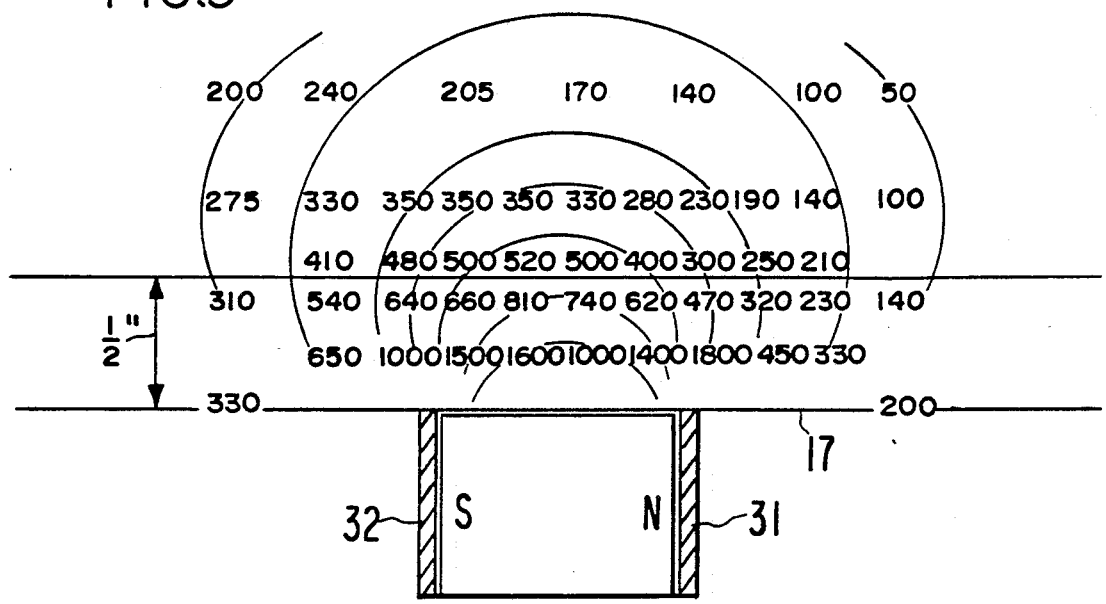
Figure 10A:
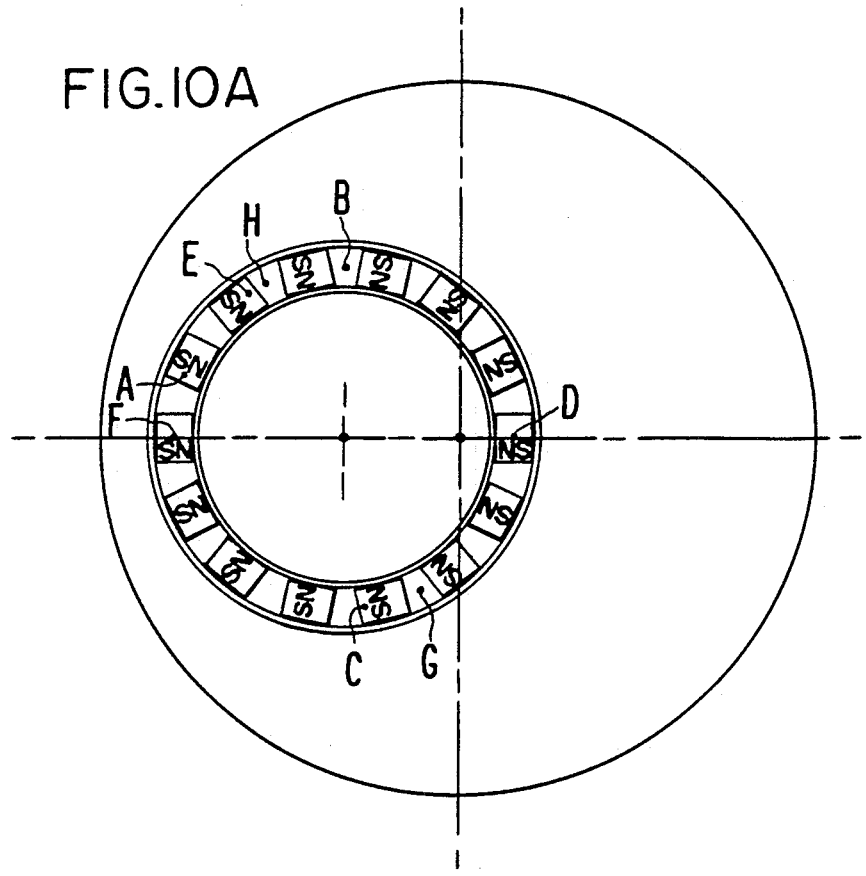
Figure 10B:
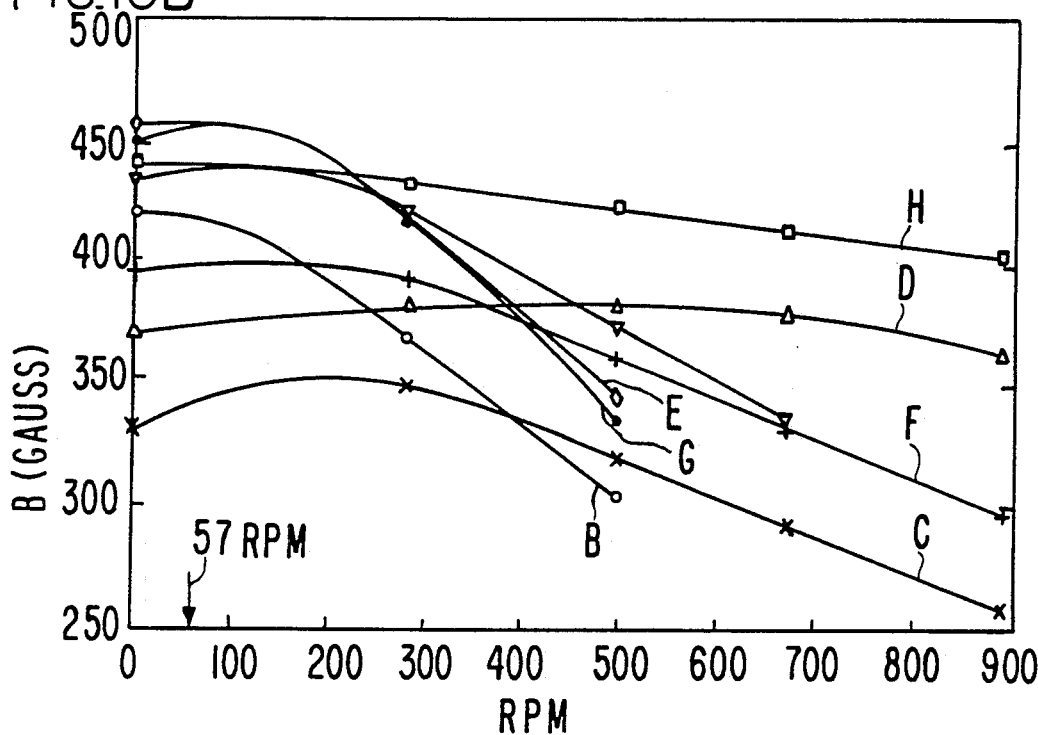
Figure 11A:
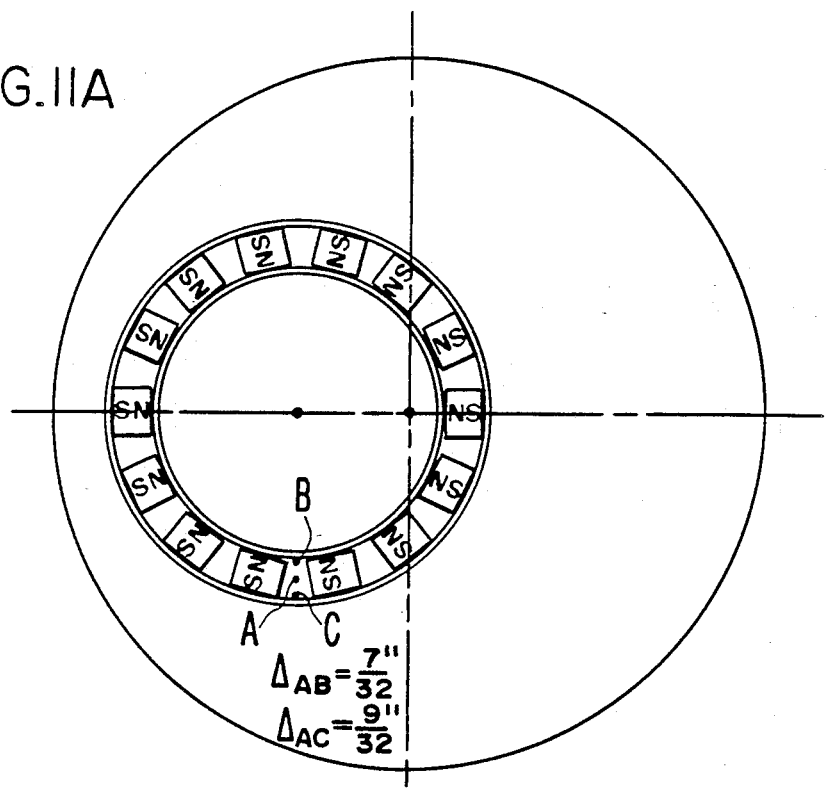
Figure 13:
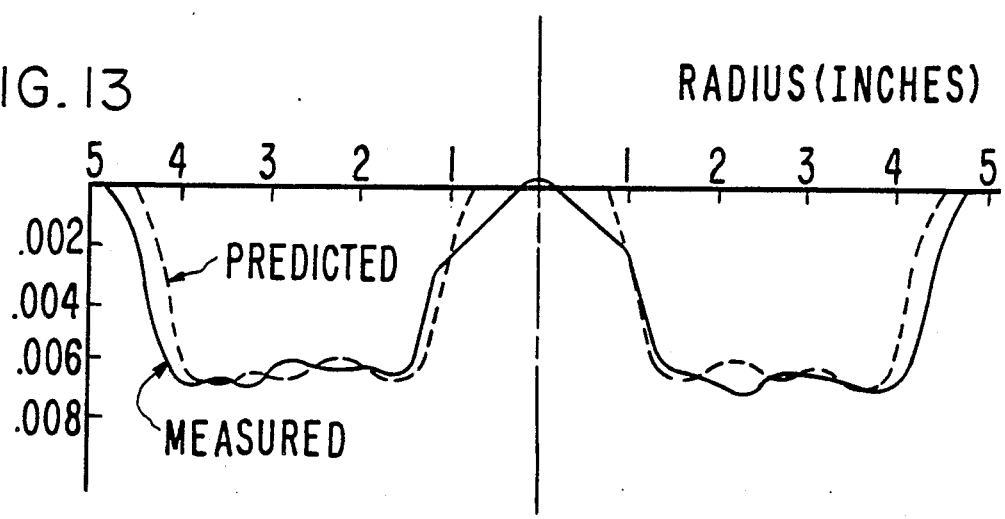
Figure 14B:
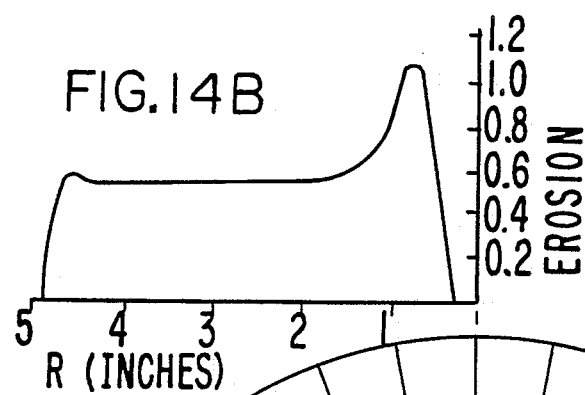
Figure 14A:
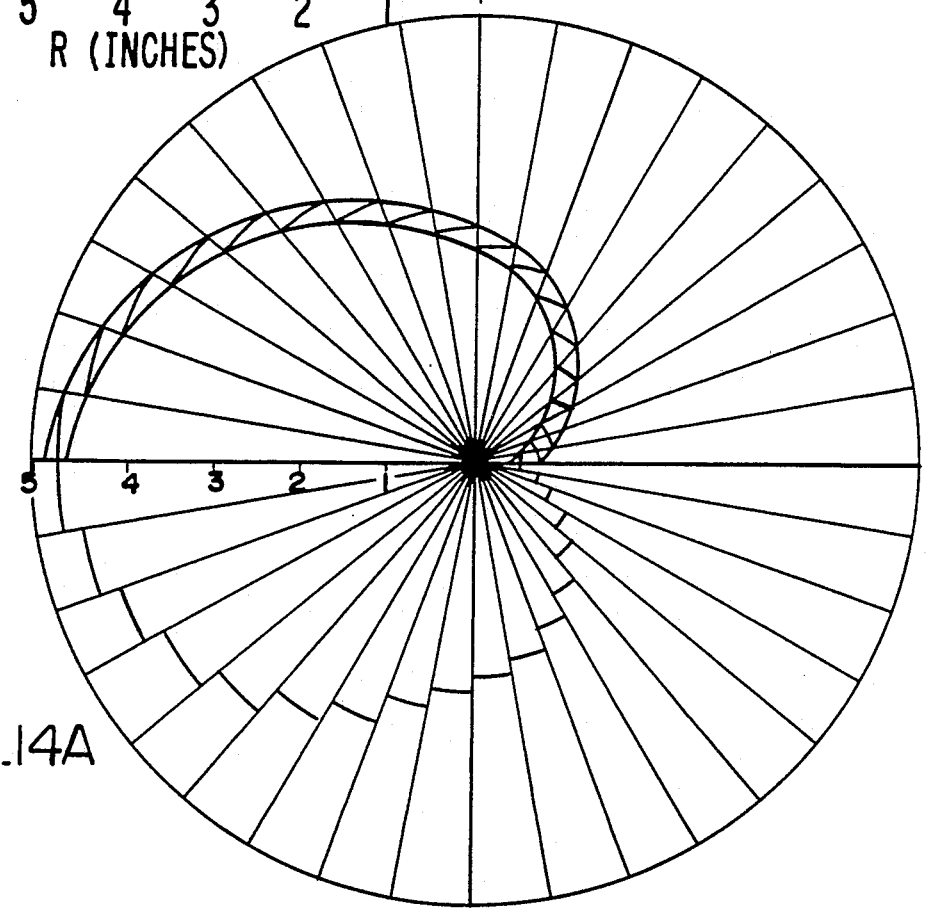
Figure 15A:
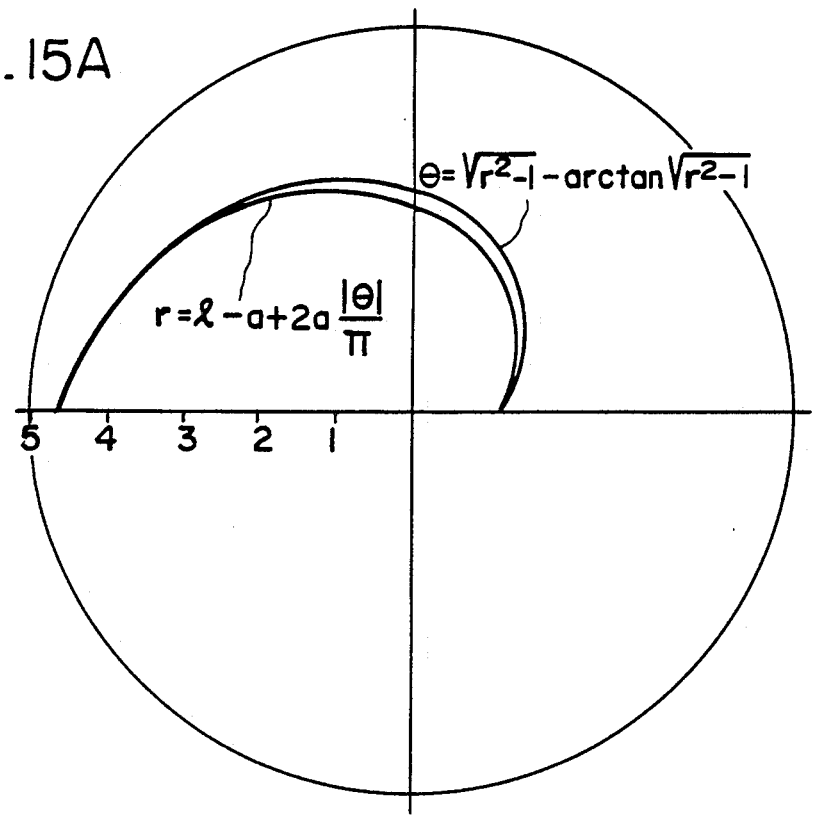
Figure 15B:
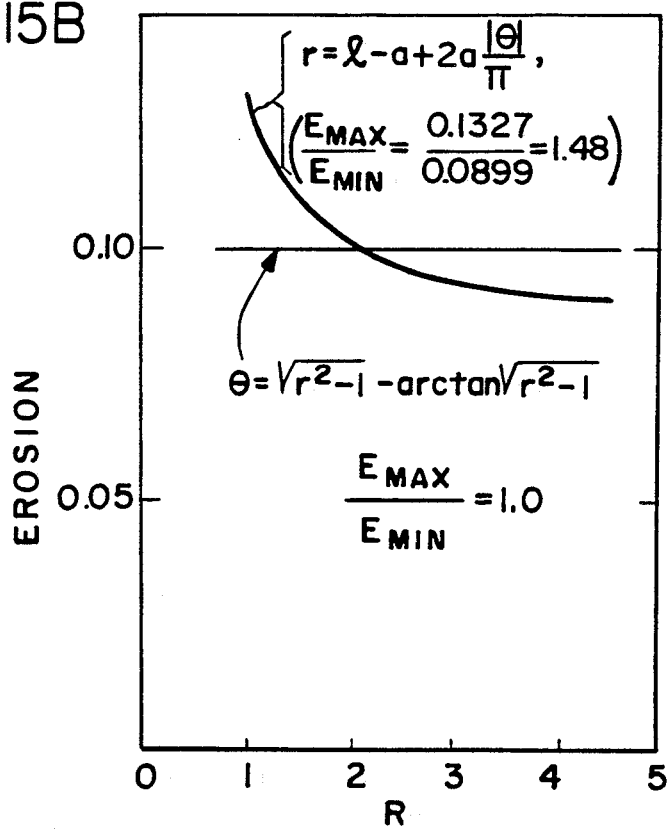

FIG. 9 shows the magnetic field for the embodiment of FIG. 8;

FIG. 10A shows a circular magnet array used for eddy current measurements;

FIG. 10B shows the effect of eddy currents during the rotation of the magnet of FIG. 10A at the locations indicated by the letters A-H;

FIG. 11A shows a circular magnet array;

FIG. 11B shows the effect of the eddy currents due to the rotatin of the magnet array of FIG. 11A as a function of locations A-C as indicated in FIG. 11A;

FIGS. 12A-E show alternate embodiments for the centerline of the magnetic means of the present invention corresponding to preselected erosion profiles;

FIG. 13 shows the measured erosion profile for the embodiment of FIG. 8 compared to the predicted profile;

FIG. 14A show a magnet structure constructed in accordance with the teachings of European Patent Application Publication No. 211412;

FIG. 14B shows the calculated erosion profile for the magnet structure of FIG. 14A;

FIG. 15A compares the equation suggested for uniform erosion by Japanese Patent Publication No. 62-211,375 with the equation for uniform erosion taught herein;

FIG. 15B compares the erosion profiles associated with the two curves shown in FIG. 15A.

DETAILED DESCRIPTION

FIG. 1A shows a partially schematic perspective view of a prior art sputtering device 1 which includes stationary planar magnetron 2. Magnetron 2 includes anode 4 connected to ground potential and cathode (target) 6 connected to a negative high voltage source (not shown). Target 6 is in the shape of an annulus, initially (i.e. before sputtering occurs) having a planar top surface 6a. A plurality of permanent magnets 8 shown in FIG. 1B are arranged in a circular pattern beneath target 6. An inert gas at low pressure, for example Argon at 5 millitorr, is introduced into vacuum chamber 5 containing magnetron 2 through gas inlet port 3. Vacuum chamber 5 is connected to a vacuum pump (not shown) for evacuation of the chamber before the introduction of the inert gas.

A wafer w is held by a suitable wafer holding means 7 attached to chamber 5 so that the planar surface of the wafer to be coated is exposed to and parallel to planar surface 6a of target 6.

In operation, the magnetic field lines, indicated by arrows B, confine the discharge to annular region 12, where energetic ions in the discharge bombard and erode target 6 by dislodging aluminum atoms, some of which coat the planar surface of wafer w. The energetic ions in the discharge erode an annular groove 3 in target 6, and as discussed above, this localized erosion generates a non-uniform distribution of sputtered atoms.

Figure 2A:
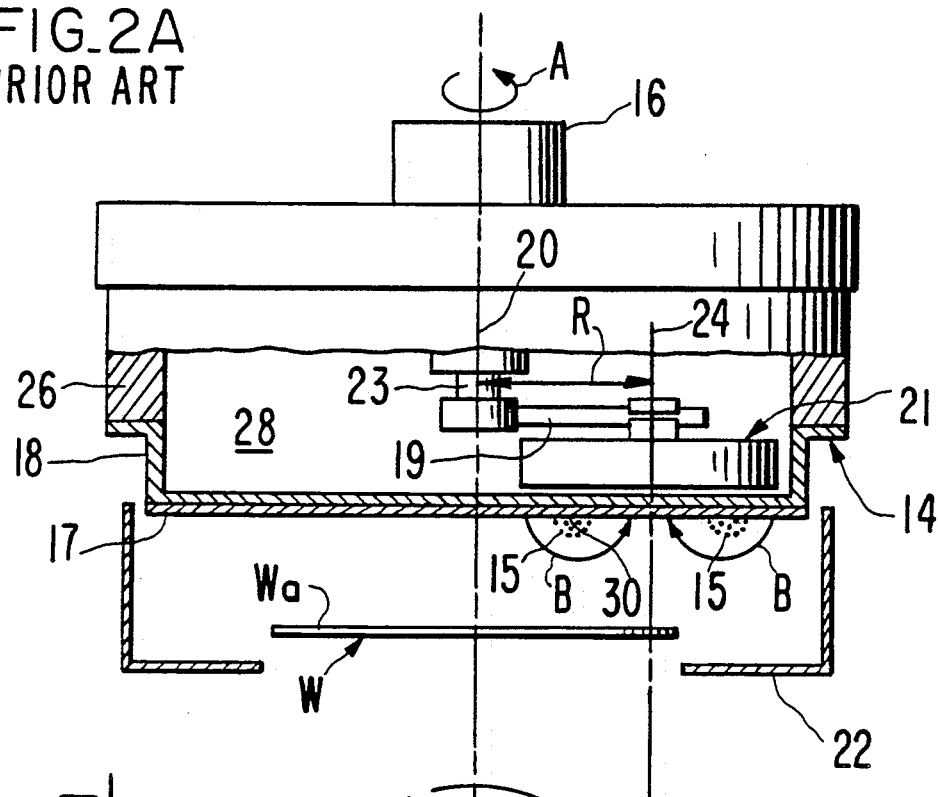
FIG. 2A shows a simplified view of a prior art sputtering device including a rotating magnet assembly.

FIG. 2A shows a simplified view of a prior art Versamag ™ sputtering source 14 sold commercially by Varian Associates, Inc., the assignee of the present application. It will be understood that source 14 is contained in a vacuum chamber (not shown), and that an inert gas is introduced into the chamber as explained in connection with FIG. 1.

Source 14 includes motor 16 which rotates shaft 23 about axis 20 as indicated by arrow A. Magnet support shaft 19 extends perpendicularly from shaft 23 and supports magnet assembly 21 attached thereto. Thus the central axis 24 of magnet assembly 21 is displaced from axis 20 by a distance R.

Magnet assembly 21 includes a magnet array similar to that shown in FIG. 1B, with the permanent magnets arranged in a circle so that a circular annular discharge 15 confined by magnetic lines B is produced in operation.

Target (cathode) 17 is disk shaped and is connected to a negative high voltage source (not shown). Plasma shield 22, attached to the vacuum chamber (not shown) is electrically grounded and serves as an anode. Target 17 is bonded to the backing plate 18. Backing plate 18, which is attached to housing 26, supports target 17. Housing 26 together with backing plate 18 form a water-tight chamber 28 for holding a water bath for cooling the target.

Wafer w is supported by a wafer support (not shown) attached to the vacuum chamber so that the to-be-coated top surface $w_a$ of wafer w is beneath and parallel to target 17.

Figure 2B:
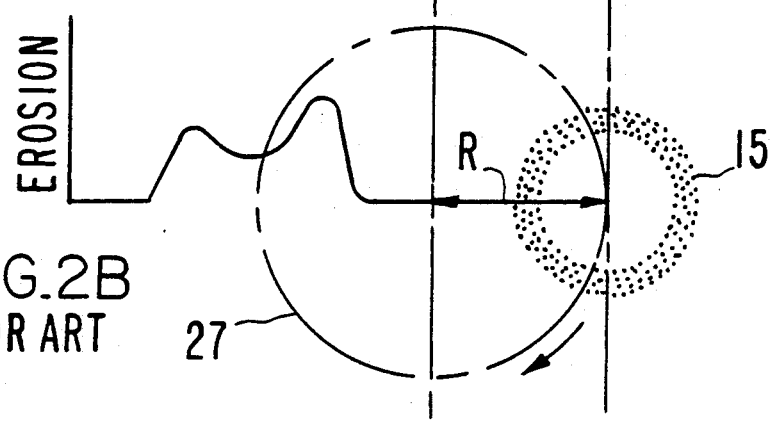
FIG. 2B shows the erosion profile generated by the source of FIG. 2A.

In operation, motor 16 rotates shaft 23 so that the entire magnet assembly 21 is rotated about axis 20. The erosion pattern produced in target 17 by this rotation is more complex than a simple groove. FIG. 2B, which is vertically aligned with FIG. 2A, shows a partial cross section (with the vertical scale enlarged for clarity) of target 17 which shows the depth profile of the erosion in target 17 generated by rotating magnet assembly 21 about axis 20 at a constant velocity a large number of times. Dot-dash line 27 shows the path of axis 24. Discharge 15 is shown in its initial position in FIG. 2B. Discharge 15 of course rotates with axis 24 about axis 20. As may be seen in FIG. 2B, the erosion of target 17 is not uniform when circular annular discharge 15 is rotated.

The present invention relates to a magnet assembly which may be substituted for the magnet assembly 21 in the structure shown in FIG. 2A and which, in operation, when rotated about axis 20, will generate a pre-specified erosion profile in target 17. Of particular interest is the case where the erosion profile is selected to have constant depth.

The theoretical basis of the present invention may be better understood by first considering why the erosion profile shown in FIG. 2B is non-uniform. The magnet assembly 21 shown in FIG. 2A has magnets 8 arranged circularly as shown in FIG. 1B so that the resulting circular discharge 15 (shown in FIG. 2A) may be assumed for analytical purposes to have uniform intensity in the discharge region 30 adjacent to the target 17 (the actual distribution of the intensity is approximately Gaussian).

If the magnet array 21 were held stationary, for instructive purposes, the erosion profile in target 17 can be assumed to have the form shown in FIG. 3B, which is aligned with FIG. 3A. That is, the erosion depth is constant over the width of annulus 30. The actual depth of the erosion would of course depend on the intensity of the discharge and the length of time the discharge was maintained over the target.

When the magnet array is rotated about axis of rotation 20 (axis 20 is normal to the plane of the paper in FIG. 3A) at a constant angular velocity, the amount (depth) of erosion at a point r on the erosion surface of target 17 which is at a distance of R linear units from the center of the target caused by each single complete rotation of discharge region 30 above target 17, denoted by E(R), is directly proportional to the total length of the arc segments in region 30 which rotate past the point r, i.e. to the total length of the arc segments at a distance R from the axis of rotation. In FIG. 3A, a single arc segment, Arc ($R_1$) rotates past point $r_1$ during each revolution. Two arc segments, $Arc_1$ ($R_2$) and $Arc_2$ ($R_2$) rotate past point $r_2$ during each revolution. A single arc segment, Arc ($R_3$) rotates past point $r_3$. The total length of the arc segments at a distance R from the origin is denoted by $\Sigma L$ (Arc (R)). Thus, E(R) is directly proportional to $\Sigma L$ (Arc (R)).

On the other hand, since the time it takes for an arc of unit length to rotate past a point which is at a distance R from the axis of rotation varies inversely with R, it follows that the erosion E(R) is inversely proportional to R.

Thus $$E(R) = k\Sigma L \text{ (Arc } (R))/R \tag{1}$$

where k is the constant of proportionality which depends on the intensity of the discharge and other factors.

In FIG. 3C, the shape of the erosion due to rotation of the magnet array 21 in FIG. 3B is plotted by measuring the arc lengths and using equation 1 where we have assumed k=1. The individual arc lengths shown in FIG. 3B were measured with a flexible ruler to generate FIG. 3C.

The predicted average erosion pattern of FIG. 3C, in spite of the approximation used for the stationary erosion pattern of FIG. 3B, is close to that measured. The narrower the stationary erosion pattern the better is the approximation and the less the result obtained by rotation depends on the exact shape of the stationary erosion profile.

We assume that equation (1) is, to a first approximation, valid whether the summation is taken over the arc lengths for a single revolution or whether the summation is taken over arc lengths for N revolutions. In other words, the erosion depth for N revolutions is given by $$E_n(R) = k\Sigma L \text{ (Arc } (R))/R$$

where the summation is taken over the arc lengths for N revolutions and $$E_n(R) = k \cdot N\Sigma L \text{ (Arc } (R))/R$$

where the summation is taken over the arc lengths for a single revolution

In view of this superposition principle, two erosion profiles are equivalent if one is a scalar multiple of the other.

To a first approximation, if the constant k, which depends, inter alia, on the intensity of the discharge, is increased, for example, by a factor of 2, the same total depth of erosion may be obtained by decreasing the number of revolutions by a factor of 2.

The assumption that, to a first approximation, formula (1) is valid whether the summation is taken over 1 or more revolutions has been substantiated by erosion patterns observed experimentally which are close to the predicted erosion pattern shown in FIG. 3C.

One may use formula (1) to attempt to construct geometrically a closed path for the discharge 15 which will result in uniform (constant average) erosion when the path is rotated. Such a construction is shown in FIG. 4. In FIG. 4 the center of rotation is denoted by O. The construction is carried out as follows. The interval from 0° to 360° is divided into equal angular increments (22.5° in FIG. 4).

A first radius $R_1$ of length 1 is drawn extending to the right from the origin along the 0° line. Arc ($R_1$) extends from the $-22\frac{1}{4}°$ line to the $+22\frac{1}{4}°$ line and L (Arc ($R_1$))/$R_1 = \pi/4$. In general, $R_{i+1} = R_i + \frac{1}{2}$, for i=1, ..., 8. Arc ($R_2$) has two segments $Arc_1$ ($R_2$) between $22\frac{1}{2}°$ and 45° and $Arc_2$ ($R_2$) between $-22\frac{1}{2}°$ and $-45°$, each having equal arc length. $\Sigma L$ (Arc ($R_2$))/$R_2 = \pi/4$. Similarly, $Arc_1$ ($R_3$) extends from the 45° line to the $67\frac{1}{2}°$ line and $Arc_2$ ($R_3$) extends between the $-45°$ line and the $-67\frac{1}{2}°$ line and L ($Arc_1$ ($R_3$)) = L ($Arc_2$ ($R_3$)). $\Sigma L$ (Arc ($R_3$))/$R_3 = \pi/4$. When all of the arcs have been drawn in this fashion, a first smooth curve $C_1$ is drawn connecting one set of arc end points and a second smooth curve $C_2$ is drawn connecting the other set of arc end points as shown in FIG. 4. This construction has the drawback that the width of the region between curve $C_1$ and curve $C_2$ is not constant.

At the present time, little is known relating the erosion profile to a magnetic field configuration of varying strength and width, though a promising model has been proposed by Gu et al, *Axial Distribution of Optical Emission in a Planar Magnetron Discharge,*. J. Vac Sci Technol. A, 6(5), p. 2960, Sept./Oct. (1988). Thus we adopt a different approach in which the width of the contour of the magnet is constant. This facilitates construction of a magnetron magnet structure having a uniform magnetic field along the erosion path and predictability of the erosion.

Therefore, to produce uniform erosion, we proceed analytically to find an erosion path that satisfies $$E(R) = k \Sigma L \text{ (Arc } (R))/R = K. \tag{2}$$

where K is an arbitrary constant,
and has the additional property that the width of the path is a constant w.

FIG. 5 shows an element P of a path having a centerline whose equation in polar coordinates is represented by $R = R(\theta)$. The width, w, of the path is assumed to be constant. Let $\alpha$ be the acute angle between the curve $R = R(\theta)$ and the arc segment Arc(R) at the point ($\theta$, $R(\theta)$). The arc segment Arc(R) extends from the outer edge of path segment P to the inner edge of the path segment.

We assume $E(R) = kL/R = K$     (3)

where $L = L$ (Arc $(R)$) and $k$, $K$ are constants. So $$L/R = k_1, \quad (4)$$

where $k_1 = K/k$.

We see from FIG. 5 that $$\tan \alpha \approx \tan \alpha' \approx w/d$$

so $\tan \alpha \approx w/\sqrt{L^2 - w^2}$

This approximation improves for small path width $w$. We set $$\tan \alpha = w/\sqrt{L^2 - w^2} \quad (5)$$

On the other hand, from FIG. 5 we also have $$\tan \alpha \approx \Delta R/R\Delta\theta$$

Assuming that the curve $R = R(\theta)$ is differentiable at the point $(\theta, R(\theta))$, we have $$\tan \alpha = \lim_{\Delta\theta \to 0} \left(\frac{\Delta R}{R\Delta\theta}\right) \quad (6)$$

or $$\tan \alpha = \frac{1}{R} \frac{dR}{d\theta}$$

or $$\frac{1}{R} \frac{dR}{d\theta} = \frac{w}{\sqrt{L^2 - w^2}} \quad (7)$$

From equations (5) and (6) we have $$\frac{1}{R} \frac{dR}{d\theta} = \frac{w}{\sqrt{(k_1 R)^2 - w^2}} \quad (8)$$

or $$d\theta = \frac{\sqrt{((k_1/w)R)^2 - 1}}{R} dR.$$

substituting $L = k_1 R$ from equation (4) we have $$d\theta = \frac{\sqrt{r^2 - 1}}{r} dr.$$

We define $$R_0 = w/k_1. \quad (9)$$

$R_0$ is the minimum value of the radius $R$, since $\sqrt{((k_1/w)R)^2 - 1}$ is imaginary if $R < w/k_1$. In practice $R_0$ may be chosen arbitrarily for convenience of design since $k_1$ is arbitrary.

Now define $$r = R/R_0 \quad (10)$$

so $$dr = dR/R_0 \quad (11)$$

Then equation (8) becomes $$d\theta = \sqrt{r^2 - 1}/r \, dr,$$

a differential equation that has the known solution $$\theta = \sqrt{r^2 - 1} - \arctan(\sqrt{r^2 - 1}) + C \quad (12)$$

or $$\theta = \sqrt{(R/R_0)^2 - 1} - \arctan(\sqrt{(R/R_0)^2 - 1}) + C \quad (13)$$

where $C$ is the constant of integration.

Inspection of equation (12) shows that for positive $r$ there is a real solution only if $r \geq 1$, that is, only if $R \geq R_0$. If we select $C = 0$, then $\theta = 0$ when $r = 1$, i.e. when $R = R_0$. So that for this choice of $C$, the minimum value of $R$, $R_0$, occurs when $\theta = 0$.

FIG. 6A shows a graph of the relationship 20 between $\theta$ and $r = R/R_0$ defined by equation (12) where $C = 0$, i.e., by $$\theta = \sqrt{r^2 - 1} - \arctan\sqrt{r^2 - 1} \quad (14)$$

It is important to note that the centerline of the path spirals outward, and hence it is impossible to construct a closed loop path of constant width $w$ satisfying equation (3)

$$E(R) = kL/R = K,$$

a constant, and which is differentiable at all points.

However, by making use of symmetry and relaxing the condition of differentiability at a finite number of points (which also renders the path of non-uniform width in a small neighborhood of such points), we can construct a closed loop path which in practice yields uniform erosion when magnets of equal length and width are positioned with their centers on the line defining the center of the path to create an erosion path of uniform width (except at the maximum points of non-differentiability). The maximum erosion occurs where the tangents (not shown) to the magnetic field lines (shown in FIGS. 1 and 9) are parallel to the surface of the target. This is defined to be the centerline of the magnetic means. This centerline is coincident with the curve defined by equation (14). For example, the upper half A of the curve shown in FIG. 6B is defined by equation (14) where $0 \leq \theta \leq \pi$. The lower half B of the curve is obtained by reflecting the upper half about the polar axis. Note that the resulting closed curve fails to be differentiable at the two points $(0,1)$ and $(\pi, r(\pi))$.

Alternative closed loop paths (not shown) may be defined by taking any 180° segment of the curve defined by equation (14), where $\theta_0 \leq \theta \leq \theta_0 + \pi$ and $\theta_0 > 0$ is an arbitrary angle, and reflecting this segment about the line $\theta = \theta_0$.

FIG. 6C is an expanded version of FIG. 6B where we have defined a path P comprising a segment $P_1$ of constant width $w$ centered around most of the upper curve A and a segment $P_2$ centered around most of the lower curve B. Note that a constant width path cannot be defined in small neighborhoods $N_1$ and $N_2$ of the points of non-differentiability; however, we close the path at these points with the dotted lines shown in FIG. 6C. We have verified that the effect of the non-constant path width in such small neighborhoods of these two discrete points is negligible.

FIGS. 7A and 7B show alternate multilobe embodiments for the location of the centerline of the magnets. The centerline $C_2$ in the second quadrant of FIG. 7A is defined by equation (14) where $\pi/2 \leq \theta \leq \pi$. Curve $C_2$ is reflected about the polar axis to obtain curve $C_3$. Curves $C_2$ and $C_3$ are reflected about the $\pi/2$ line to obtain $C_1$ and $C_4$.

In FIG. 7B, the centerline is defined by equation (14) for $0 \leq \theta \leq 270°$ and by equation (13) for the section of the return path between B and C. The short sections of the path between A and B and between C and D were selected arbitrarily to form a closed path.

Some advantages of a multilobe magnet over the single lobed, heart shaped magnet are:

a. It need not be rotated as fast to obtain the same averaging. A two lobe magnet need only be rotated 1/2 as fast, a three lobe magnet 1/3 as fast.
b. The magnet is symmetrical about the center of rotation and is mechanically balanced.
c. The added lobes and associated cusps give added degrees of freedom since they can be adjusted separately if desired. For example, the cusps could be adjusted separately to give erosion to the very center of the target.
d. Because the length of the stationary erosion groove is longer the electrical impedance of the source will be smaller.

The design shown in FIG. 7B is useful in that it naturally allows the erosion to extend closer to the center of the source than the path of FIG. 7A. This magnet will have the longest stationary erosion profile and therefore the lowest impedance. The larger the diameter of the source the better this design works. For very large diameter sources it may be the design of choice.

We have constructed a sputtering apparatus based on the curve shown in FIG. 6B taking into account the following design considerations.

a. The magnet should be light weight and relatively easy to construct.
b. The magnetic field should be uniform and narrow around the circumference so that the mathematical predictions are valid.
c. The design should be such that the desired contour can be accurately followed.
d. The magnetic field should be high to keep the impedance of the source low.

FIG. 8A shows a layout of a magnet design we have constructed which satisfies these requirements. This magnet may be used for magnet array 21 in FIG. 2A. Permanent magnets $M_1$ through M-as shown in FIG. 8B are sandwiched between iron keepers 31,33 which retain the magnets in position and act to distribute the magnetic field uniformly along the magnet and to accurately define the contour of the magnet. The keepers may be spot welded to a magnet support. Alternatively, the magnetic means may be a unitary magnet having the contour defined by keepers 31 and 33.

The curve A,B shown in FIG. 8B passes through the center of each magnet and the centerline $C_i$ of each magnet is perpendicular to the curve A,B. It is convenient for the thickness of the keeper to be sufficiently small so that it is flexible enough to be bent to the required contour. Tests were made to determine the required thickness for the iron keepers. Permanent magnets were placed between keepers of varying thickness. The magnets used were samarium cobalt with an energy product of 18 MGO having dimensions $\frac{3}{4}''$ by $\frac{3}{4}''$ by $0.32''$. In most cases two magnets were used to form each unit so the magnet was 0.64" deep. The spacing between the magnets was also varied. From these tests it was found that a thickness of 1/16 inch was sufficient (see Table 1 below).

TABLE 1

| Separation | Effect of Keepers Keepers | B at 0.570 inch |
|---|---|---|
| 0.3 inch | 1/16 | 530 gauss |
| 0.3 | 3/32(1/16 + 1/32) | 550 |
| 0.3 | ⅛(1/16 + 1/16) | 550 |
| 0.3 | ⅛ | 550 |
| 0.45 | 1/16 | 450 |
| 0.45 | ⅛ | 450 |

The magnetic field was measured with a Hall probe and the resulting field plot is given in FIG. 9. The measurements were made with the magnet array used in the previous test using 1/16 inch thick keepers with the spacings between magnets of 0.4 inches. The maximum field at a point ½ inch above the magnet, the distance normally required for the target and backing plate, is over 500 gauss. This is a stronger field than necessary. With stronger magnets this field would be even higher allowing us to go to thicker targets if desired. From the shape of the field lines a very narrow stationary erosion groove is predicted. This is an advantage for our design since it allows the stationary erosion profile to be well defined and predictable.

It is a concern that eddy currents in the target and the backing plate due to the motion of the magnet will degrade the magnetic field and adversely effect the operation of the source. These effects were determined experimentally. Two large disks, one of aluminum and one of copper, each ¼ inch thick, were bolted together simulating the target and backing plate of the sputtering source. The disks were mounted on a lathe and rotated with varying speeds. The magnet assembly shown in FIG. 10A was mounted on one side and a Hall probe on the other. Measurements were made on various locations A-H of the magnet as indicated in the figure. In normal operation in a Versamag TM source (FIG. 2) the magnet is rotated at 57 rpm or less. At these frequencies the effects of the eddy currents are small as is seen from FIG. 10B. As expected, the effect of the eddy currents depends on location. Also, for a given location A-C along the contour, the effect of the eddy currents is to shift the field lines to one side as can be seen from FIGS. 11A and 11B. Again below 57 rpm, it appears that this effect can also be ignored.

The analysis and construction given above may be generalized in an important way. It may be extended to the case where the erosion profile is not constant.

Again we assume the width of the stationary discharge path is a constant w. If we let E(R) be a preselected, non-constant erosion profile, then again $E(R) = kL \, (\text{Arc } (R))/R$ or $$E(R) = kL/R, \tag{G-1}$$

where $L = L \, (\text{Arc } (R))$.

As before, from FIG. 5, we have $$\tan\alpha = \frac{dR}{Rd\theta} = \frac{w}{\sqrt{L^2 - w^2}}$$

Using equation (G-1), $$\frac{dR}{Rd\theta} = \frac{w}{\sqrt{(RE(R)/k)^2 - w^2}} \tag{G-2}$$

We define $R_0E(R_0)/kW=1$, where $R_0$ is the minimum radius
and $E(R_0)$ is the erosion at $R=R_0$.
Then equation (G-2) becomes $$d\theta = \sqrt{\left(\frac{RE(R)}{R_0E(R_0)}\right)^2 - 1} \cdot \frac{dR}{R} + C \tag{G-3}$$

We define the normalized radius $u=R/R_0$ and the normalized erosion $$\xi(u) = E(R)/E(R_0).$$

Then $d\theta = \sqrt{u^2\xi^2(u) - 1} \cdot \frac{du}{u}$ (G-4)

so that $$\theta = \int_1^r \sqrt{u^2\xi^2(u) - 1} \; \frac{du}{u} + C$$

where r is the upper limit of integration or $$\theta = \int_{R_0}^R \sqrt{\left(\frac{RE(R)}{R_0E(R_0)}\right)^2 - 1} \; \frac{dR}{R} + C \tag{G-5}$$

There is essentially no restriction on the preselected erosion profile $\xi(u)$ except that the definite integral $$\int_1^r \frac{\sqrt{(\xi^2(u) u^2 - 1}}{u} \, du \text{ should exist}$$

which is satisfied, inter alia, if $\xi(u)$ is piecewise continuous and $\xi(u)u>1$.

Equation (G-4) defines the relationship between $\theta$ and r and the integration required in equation (G-4) can be accomplished numerically to graph the relationship between $\theta$ and r.

Proceeding as before, we can construct a closed loop path using equation (G-4) or (G-5) to define the centerline of the path over a selected angular interval. For example, if (G-4) defines the centerline segment for $0 \leq \theta \leq \pi$, we can construct a closed curve centerline by reflecting this segment about the polar axis.

For $r \geq \pi/2$ we have found a convenient approximation of the form $$\theta = C(r) (\sqrt{r^2 - 1} - \arctan \sqrt{r^2 - 1}) \tag{G-6}$$

The form of $C(r)$ is suggested by the fact that if $u^2\xi^2(u) >> 1$ for $u \geq u_0$ then equation (G-4) can be replaced by $$\theta = \int_{u_0}^r \xi(u) du \tag{G-7}$$

On the other hand, from (G-6) for $r >> 1$ we have $$\theta = C(r)(r - \pi/2) \tag{G-8}$$

thus we define $C(r)$ by $$C(r) = \frac{1}{r - \pi/2} \int_{\pi/2}^r \xi(u)du, \; r \geq \pi/2. \tag{G-9}$$

For $1 \leq r < \pi/2$, we take $C(r)=1$ in (G-5), which yields the equation for uniform erosion. With this approximation, we can design a path which gives uniform erosion for $1 \leq r \leq \pi/2$ and arbitrary erosion for $r > \pi/2$. Using equations (G-6) and (G-9) we have calculated the contour of the magnet required to product a given erosion profile for several selected erosion profiles. FIGS. 12A–E show the results of these calculations. The center line (not shown) of each contour is defined by equation (G-4) and approximated by equation (G-6) and (G-9). The width of each contour is constant and preferably small.

Column 1 of FIGS. 12A–12E shows the preselected erosion profile. Column 3 shows the calculated shape of the magnet corresponding to the preselected erosion profile in Column 1. Equations (G-6) and (G-9) were employed to determine the center line of the magnet. Appendix 1 gives a listing of the computer program suitable for computing the center line corresponding to the constant erosion profile of FIG. 12A and corresponding to the sloped erosion profiles of FIGS. 12B and 12 C.

Column 2 provides a graphical simulation of the erosion profile obtained by the technique used to construct FIG. 3C as explained above. The agreement between the design erosion profiles (column 1) and the profiles obtained by the graphical check (column 2) is very good. The magnet shapes at first glance seem very similar, but careful inspection reveals significant differences which give the rise to the different erosions.

The ability to design a magnet having a preselected erosion profile is significant since it allows us to vary the shape of the erosion in a predictable and controlled manner in order to achieve a sputtered film having selected properties. It is ultimately the selected properties and quality of the sputtered film that is most important. A non-optimum erosion profile may be preferred if it results in a more uniform film or in a film having other selected depth characteristics.

The ability to control the erosion profile allows us to operate at smaller target height and wafer distances. In particular, the uniform erosion profile produced by the magnet array in FIG. 8 permits close coupling between the wafer and the target. This reduces gas scattering and increases sputtering rates resulting in greater throughput. Greater target utilization also results since there are less side losses of the sputtered atoms. With uniform erosion, the distance between the target and the magnet can be varied (by apparatus not shown) as the target erodes, keeping the electrical properties of the source constant during the lifetime of the target.

The magnet array shown in FIG. 8 has been tested by using it in place of the prior art magnet assembly 21 in sputtering source 14 shown in FIG. 2B. It was found that this new source would operate at pressures as low as 0.2 millitorr. It was also tested at pressures between 2 and 10 millitorr. At a current of 5 amperes and a pressure of 5 millitorr, the static impedance is about 70 ohms and the dynamic impedance is about 15 ohms.

FIG. 13 shows the measured erosion profile of this new source and compares the result with the predicted profile using the graphical simulation technique explained in connection with FIGS. 3A and 3C. The agreement between the measured and predicted erosion is very good.

It is instructive to compare the above embodiments with the designs suggested in European Patent Application Publication No. 211412 and Japanese Patent Application Publication No. 62-211,375, previously referred to.

FIG. 14A shows a magnet constructed in accordance with the teachings of the '412 publication. FIG. 14B shows the calculated erosion profile for such a magnet. Note that the erosion is not uniform at small radii.

The '375 publication asserts that magnets arranged along a heart-like closed curve expressed by the following equation $$r = l - a + 2a|\theta|/\pi \quad (A-1)$$

gives uniform erosion (but non-uniform film thickness). FIG. 15A compares the equation (A-1) of the '375 with equative equation (14) we have derived for uniform erosion. These curves are significantly different in that they lead to substantially different erosion patterns FIG. 15B shows that the erosion profile for Equation (14) which is flat and the erosion profile corresponding to Equation (A-1) is not constant and indeed varies by approximately 48% over the same range of R.

The embodiments of the invention described herein are intended to be exemplary and not limiting and many variations and substitutions will be obvious to one of average skill in the art in view of the above disclosure.

Appendix 1

```
c    file name - heart4.004
c
c    This file calculates theta and e from r for the
c    Helmer formula, theta-C(r/r0)*sqrt((r/r0)**2-1)-
c    atan(sqrt((r/rd)**2-1)) using C(r/r0)-1+a*(r/r0-1)/2
c    dCdr-Cp(r/ro)-a/ro/2
c
c    Open an output file
     open (7,file-'heart4.out', status-'new')
     rewind(7)
c
c    Obtain dr
     write(6,11)
  11 format('0',4x,'dr - F4.2')
     read(5,12)dr
  12 format(F4.2)
c
c    obtain w
     write(6,23)
  23 format('0',4x, 'w - F4.2')
     read(5,24)w
  24 format(F4.2)
c
c    Obtain r0
     write(6,33)
  33 format('0',4x, 'r0 - F4.2')
     read(5,34)r0
  34 format(F4.2)
     r-r0
c
c    Obtain parameters for C(x)
     write(6,43)
  43 format('0',4x, 'a - F5.3')
     read(5,44)a
  44 format(F5.3)
```

Appendix 1 -continued

```
c
c    Write input parameters to output file
     write(7,131)
 131 format('0',4x,'Program Heart4.004')
     write(7,132)r0,w,a
 132 format('0',4x,'r0 - ',F4.2,' w - ',F4.2,' a - ',F5.3)
c
  15 continue
c
c    Calculate C and Cp.
     x-r/r0
     z-sqrt(x**2-1)
     c-1+a*(r/r0-1)/2
     cp-a/r0/2
c
c    Calculate theta
     tt-sqrt(x**2-1)-atan(sqrt(x**2-1))
     theta-57.296*c*tt
c
c    Calculate dtheta/dr
     dthetadr-(c/r)*z+cp*tt
c
c    Calculate the erosion, e
     e-r0*sqrt(1/r**2+dthetadr**2)
c
c    write to scope r,theta, and e
     write (6,121)r,theta,e
 121 format('0',4x,'r - ',F4.2,' theta - ',F8.4,' e - ',F10.8)
c
c    Write to output file r,theta, and e
     write(7,121)r,theta,e
c
     r-r+dr
     if(theta.GT.180.0)go to 301
     go to 15
 301 continue
c
     stop
     end
```

What is claimed is:

1. A magnetron sputter apparatus comprising: a vacuum chamber;
means for holding a target having a front surface in said vacuum chamber; and
rotatable magnetic means for generating a moveable magnetic field over said front surface of said target, said magnetic means being configured so that at least a first portion of the normalized centerline of said magnetic means is describable by an equation of the form $$\theta = \int_1^r \frac{\sqrt{(\xi^2(u)u^2 - 1}}{u} du + C$$

where $\xi(u)$ is a preselected normalized erosion profile to be generated in said target during rotation of said magnetic means, C is a selected constant, and $\theta$ has a selected range.

2. A sputtering apparatus as in claim 1 wherein said preselected erosion profile $\xi(u)$ is constant and said first portion is describable by an equation of the form $$\theta = \sqrt{r^2 - 1} - \arctan \sqrt{r^2 - 1} + C$$

,where C is a selected constant.

3. A sputtering apparatus as in claim 1 wherein said centerline forms a closed curve and each portion of said curve is described by an equation of said form for a selected choice of C and a selected range of $\theta$.

4. A sputtering apparatus as in claim 1 wherein a second portion of said centerline is obtained by reflection of said first portion about a selected axis.

5. A sputtering apparatus as in claim 1 wherein said magnetic means comprises a first plurality of magnets having uniform length, the center of the centerline separating the poles of each of said magnets in said first plurality lying on said first portion.

6. A sputtering apparatus as in claim 4 wherein said magnetic means comprises a first plurality of magnets and a second plurality of magnets, the center of the centerline separating the poles of each magnet of said first plurality lying on said first portion, the center of the centerline separating the poles of each magnet of said second plurality lying on said second portion.

7. A sputtering apparatus as in claim 1 including a first and a second retaining means of magnetic material each uniformly spaced from said first portion over most of said portion in order to distribute the magnetic field generated by said magnetic means uniformly along said first portion.

8. A sputtering apparatus as in claim 7 wherein said retaining means are flexible.

9. A sputtering apparatus as in claim 1 wherein $0 \leq \theta \leq \pi/2$.

* * * * *